United States Patent [19]
Myers

[11] Patent Number: 5,659,269
[45] Date of Patent: Aug. 19, 1997

[54] ZERO PHASE ERROR SWITCHED-CAPACITOR PHASE LOCKED LOOP FILTER

[75] Inventor: Brent A. Myers, Palm Bay, Fla.

[73] Assignee: Harris Corporation, Melbourne, Fla.

[21] Appl. No.: 402,381

[22] Filed: Mar. 13, 1995

[51] Int. Cl.$^6$ ........................................... H03L 7/093
[52] U.S. Cl. ................... 331/17; 331/14; 327/156; 327/337; 333/173
[58] Field of Search .................... 327/144, 147, 327/156, 554, 555, 94, 336, 337, 102; 331/17, 25, 14; 333/173; 375/376

[56] References Cited

U.S. PATENT DOCUMENTS

| | | | |
|---|---|---|---|
| 4,496,858 | 1/1985 | Smith | 327/337 X |
| 4,616,185 | 10/1986 | van Roermund | 327/356 |
| 4,857,778 | 8/1989 | Hague | 333/173 |
| 4,987,373 | 1/1991 | Soo | 331/25 X |
| 5,327,092 | 7/1994 | Inogai et al. | 327/554 |
| 5,376,891 | 12/1994 | Kirchlechner | 327/3 |

*Primary Examiner*—Robert Pascal
*Assistant Examiner*—Arnold Kinkead
*Attorney, Agent, or Firm*—Rogers & Killeen

[57] ABSTRACT

A loop filter for a phase locked loop (PLL) circuit may include two operational amplifiers and switched-capacitors connecting the inverted input and output of the operational amplifiers, the switched-capacitors replacing resistors found in conventional loop filters for PLL circuits. The loop filter may be in a monolithic integrated circuit, and the PLL circuit may operate with a response time heretofore available only with individual (non-IC) components. Phase error due to amplifier offset may be reduced with offset nulling techniques.

17 Claims, 2 Drawing Sheets

ZERO PHASE ERROR SWITCHED-CAPACITOR PHASE LOCKED LOOP FILTER

BACKGROUND OF THE INVENTION

The present invention is directed to phase locked loop (PLL) circuits, and more particularly to a loop filter for a PLL circuit in a monolithic integrated circuit (IC).

A PLL circuit is typically used to reduce the phase difference between an input signal and an output from a voltage controlled oscillator (VCO). An input signal is provided to a phase detector and its phase is compared to the phase of a signal from the VCO. The phase difference (i.e., the phase error) is provided to a loop filter where it is converted to a voltage and filtered. The output of the filter is a control voltage that is provided to the VCO and used to align the VCO phase more closely to the phase of the input signal.

A common method of converting phase error to a control voltage includes charging an integrating capacitor with a current for a period of time proportional to the phase error. For example, and with reference to FIG. 1, a phase error $\phi_e$ from a phase detector 10 may be provided to a charge pump 12 that generates the current, and thereafter to a loop filter 14 that performs the integration function and provides the control voltage to the VCO 16. The loop filter 14 typically consists of an operational amplifier 18 that has its input and output connected with a resistor 20 and capacitor 22 in series. The input of the operational amplifier 18 may be connected to the charge pump 12 through a resistor 24, and the output connected to the VCO 16.

The response time of the PLL circuit (time to "lock" the phase) is a function of the characteristics of the circuit components, including the resistor 20 and capacitor 22 in the loop filter. In PLL circuits in which the response time is to be particularly brief, on the order of several milliseconds, the resistor 20 has values in the range of 10 Kohms to 100 Kohms and the capacitor has values in the range of 0.01 µF to 10 µF. While individual (non-IC) components with these values are available for use in PLL circuits, the individual components are too large for many applications, such as where a monolithic IC PLL circuit is desired. However, components with these values are simply not presently manufacturable in monolithic ICs, and it is one of the objects of the present invention to provide a loop filter for a monolithic integrated PLL circuit that meets the response time heretofore achievable only from individual components.

One of the disadvantages of the use of single operational amplifier 18 in the loop filter 14 of the prior art is the lack of precise control of phase error due to the offset limitations of the operational amplifier 18. For example, and with reference to FIG. 1, the phase error at the phase detector output is given by, $$\phi_e = V_{off}(2\pi/V_{ref}) \qquad (1)$$

If Vref is 0.5 V and Voff is 10 mV, the phase error would be 0.125 radians or 7.2 degrees. This result is unacceptable for systems in which accurate phase tracking is required, such as quadrature demodulators. It is desirable that the phase error be less than about two degrees.

It is also desirable to use a loop filter in a PLL circuit that replicates the behavior of the loop filter of FIG. 1 in order to maintain equivalent operation. Namely, $$V_{out} = -I_0[(1/C22\ s) + R20] \qquad (2)$$

where $I_0 = V_{ref}/R24$, C22 is the capacitance of capacitor 22 and R20 is the resistance of resistor 20.

One solution to these problems is to replace the resistors of FIG. 1 with switched-capacitor equivalents. However, this solution does not resolve the amplifier offset problem. Further, the amplifier 18 would periodically be placed in an entirely open loop configuration as the switches of the switched-capacitor equivalents toggled. Switched-capacitor networks require a capacitor between the output and the inverting input of all amplifiers in order to assure stable operation, and if such a capacitor were added to FIG. 1, the open loop response of the loop filter would not replicate the behavior of the loop filter in FIG. 1.

Accordingly, it is an object of the present invention to provide a novel PLL circuit that obviates the problems of the prior art.

It is another object of the present invention to provide a novel monolithic IC PLL circuit with a response time of several milliseconds.

It is yet another object of the present invention to provide a novel monolithic IC loop filter for a PLL circuit in which switched-capacitors replace the resistors in the filter.

It is still another object of the present invention to provide a novel monolithic IC loop filter for a PLL circuit that uses two operational amplifiers and switched-capacitors instead of resistors.

It is a further object of the present invention to provide a novel loop filter for a PLL circuit that provides precise phase error control.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
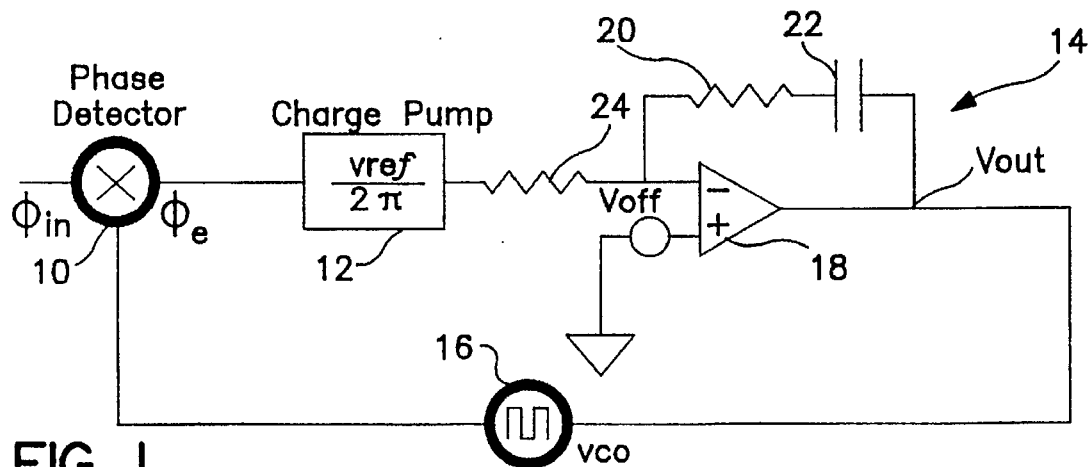
FIG. 1 is a part block, part circuit diagram of a prior art PLL circuit.
Figure 2:
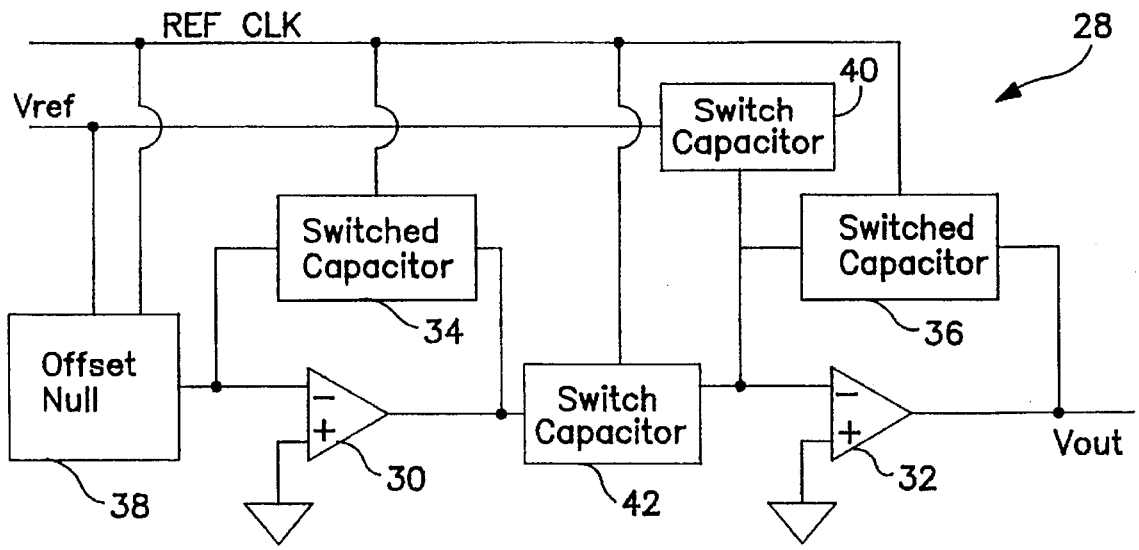
FIG. 2 is a block diagram of an embodiment of the loop filter of the present invention.

With reference now to FIG. 2, an embodiment of the loop filter 28 for a PLL circuit may include two operational amplifiers 30 and 32 connected in series. The first amplifier 30 may be offset nulled to eliminate the effects of the offset of amplifier 18 (FIG. 1). In the embodiment of FIG. 2, an input phase error signal Vref is received as an input to the first operational amplifier 30 and a control voltage Vout is provided from the output of the second operational amplifier 32. Each of the operational amplifiers has its inverted input and its output connected by a switched-capacitor circuit 34 and 36 that operates responsively to a clock input RefClk. As will be discussed in more detail below, the switched-capacitor circuits 34, 36, 40, and 42 replace resistors that may have been used heretofore. The polarity of the phase error signal may be reversed in switched-capacitor circuit 40 so that both the integrating and damping terms (discussed further below) have the same sign.

Figure 3:
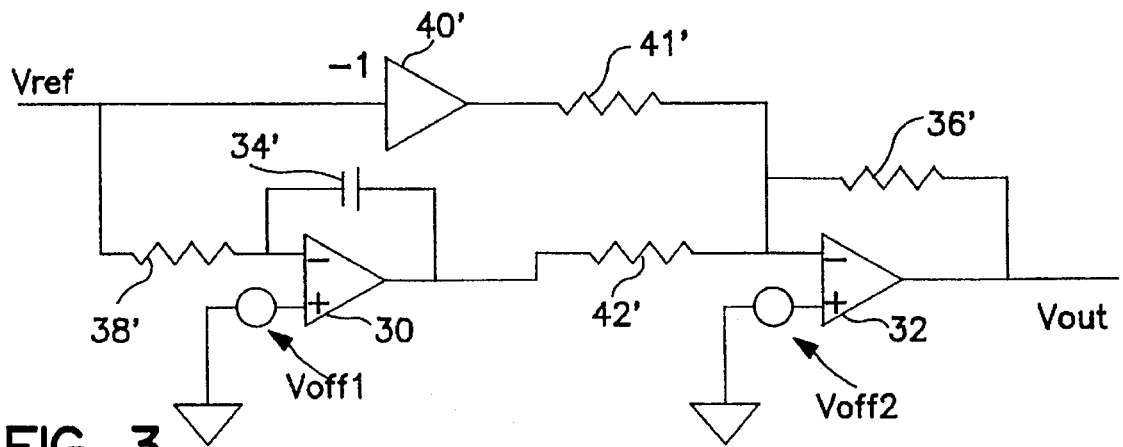
FIG. 3 is a circuit diagram of a continuous time circuit equivalent to the switched-capacitor embodiment of FIG. 2.

The loop filter of FIG. 2 may be more clearly understood with reference to FIG. 3 that illustrates a circuit similar to that of FIG. 2, but in which resistors have replaced functionally similar elements (the same element numbers have been used, with functionally similar components being denoted with ', to facilitate an understanding of the figure). The inverting stage in the path of resistor 41' simulates the inversion obtained in the actual switched-capacitor path.

Considering the operation of the device of FIG. 3, an analysis of the equivalent circuit (excluding amplifier offset) yields an open loop transfer function of, $$V_{out}=I_o(R\ 36'/R42')(1/C34's)+I_o(R38'R36'/R41') \quad (3)$$

Note that by comparing equation (3) to equation (2), reproduced below for ease of reference, $$V_{out}=-I_o[(1/C22s)+R20] \quad (2)$$

the term R36'/R42' may be considered an integrating term (C22 and C34' being equivalent), and R38'/R41' may be considered a damping term (R36' and R20 being equivalent). Where R36'=R42' and where R38'=R41', the open loop response of the equivalent circuit of FIG. 3 is the same as that of the circuit of FIG. 1 (with the exception of the sign that can be changed by inverting Vref.)

When the offsets of the amplifiers are considered, note that $$\phi_e=Voff1(2\pi/Vref) \quad (4)$$

The phase error is thereby independent of the offset voltage of the second amplifier 32. This result is achieved because the phase error manifests itself as a current through R38', that is then integrated by C34'. When the PLL is locked, this current must be zero, otherwise the integrator output voltage would change, thus modulating the voltage controlled oscillator. Since the voltage on the right of R38' is Voff1, the only way to achieve zero current is if the voltage on the left of R38' is Voff1 as well. Hence, phase error depends only on Voff1. By eliminating the offset of the first amplifier 30, zero phase error may be achieved. The second amplifier 32 contributes the resistive damping term R36' (analogous to R20 in equation 2), as well as acting as a sample and hold network. The output of the network is thereby valid at all times, even during offset compensation of the first amplifier 30.

Figure 4:
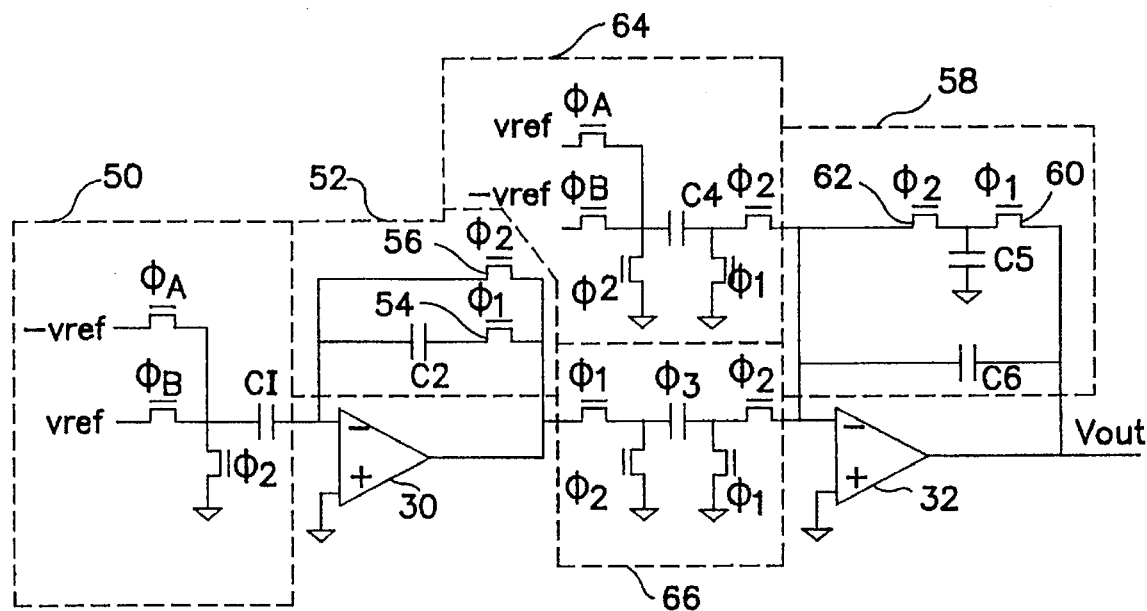
FIG. 4 is a circuit diagram of a preferred embodiment of the loop filter of the present invention.

A preferred embodiment of the loop filter may be seen in FIG. 4. Clock inputs $\phi 1$ and $\phi 2$ are 50% duty cycle non-overlapping clocks with period T. Clock signals $\phi A$ and $\phi B$ are in phase with clock $\phi 1$ and are gated with a logic signal equal to the difference in phase between the input signal $\phi$in and the VCO phase (i.e., phase error signal $\phi e$). The clock signal $\phi B$ is enabled when the VCO phase leads the input signal $\phi$in, and the clock signal $\phi A$ is enabled when the VCO phase lags the input signal $\phi$in. Reference voltages Vref and −Vref may be derived using conventional methods, such as a resistive dividing network, as a small asymmetry between them (e.g., 50–60 mV, depending on the magnitude of Vref) will not effect the steady state phase error. The switches that are connected to and operated by the clock signals may be transistors, and desirably are field effect transistors (FETs) as indicated by the FET symbols used in the figures.

The input to the first operational amplifier 30 may include an offset cancellation circuit 50 to null the amplifier offset, thereby providing more precise phase error control. The offset is stored in capacitor C1 during clock period $\phi 2$ and subtracted during clock period $\phi 1$.

Switched-capacitor circuit 52 includes capacitor C2 in series with a switch 54 operated responsively to clock $\phi 1$, these two elements being in parallel with a switch 56 operated responsively to clock $\phi 2$. Switched-capacitor circuit 58 includes capacitor C6 in parallel with a series connected switches 60 and 62 operated responsively to clocks $\phi 1$ and $\phi 2$, capacitor C5 being grounded there between. Capacitors C5 and C6 desirably have equal capacitance to simulate an ideal resistor in the feedback path. The capacitors C1–C6 may have values compatible with integrated circuit manufacture. The polarity of the input reference voltage to capacitor C4 in inverter circuit 64 may be opposite the polarity of the reference voltage being provided to capacitor C1 to ensure that both the integrating and damping terms are the same sign.

The loop filter of FIG. 4 observes the phase detector output during $\phi 1$, with any phase error during $\phi 2$ being ignored. This may result in a small phase error, but if the period T is small compared to the input reference period, the error would be small. For example, if T is 100 time less than the reference period, a maximum phase error of about 1.8 degrees would result. The first amplifier may use a conventional offset cancellation technique by storing the offset on C1 during $\phi 2$ and subtracting it out when $\phi 1$ is active.

Component values may be selected conventionally. For example, it may be assumed that the loop filter of FIG. 1 is a first order filter with appropriate values for resistors 20 and 24 and capacitor 22. These values may be used to define equivalent resistor values in FIG. 4, where the equivalent resistance of a switched-capacitor network is given by $R_i=T/C_i$. This may be used to determine capacitor values, and T may be chosen consistent with the input reference period, as discussed above. For example, C1 may be 0.1 to 0.5 pF, C2 may be 5 to 50 pF, C3 and C4 may be 0.1 to 5 pF, and C5 and C6 may be 5–10 pF.

Figure 5:
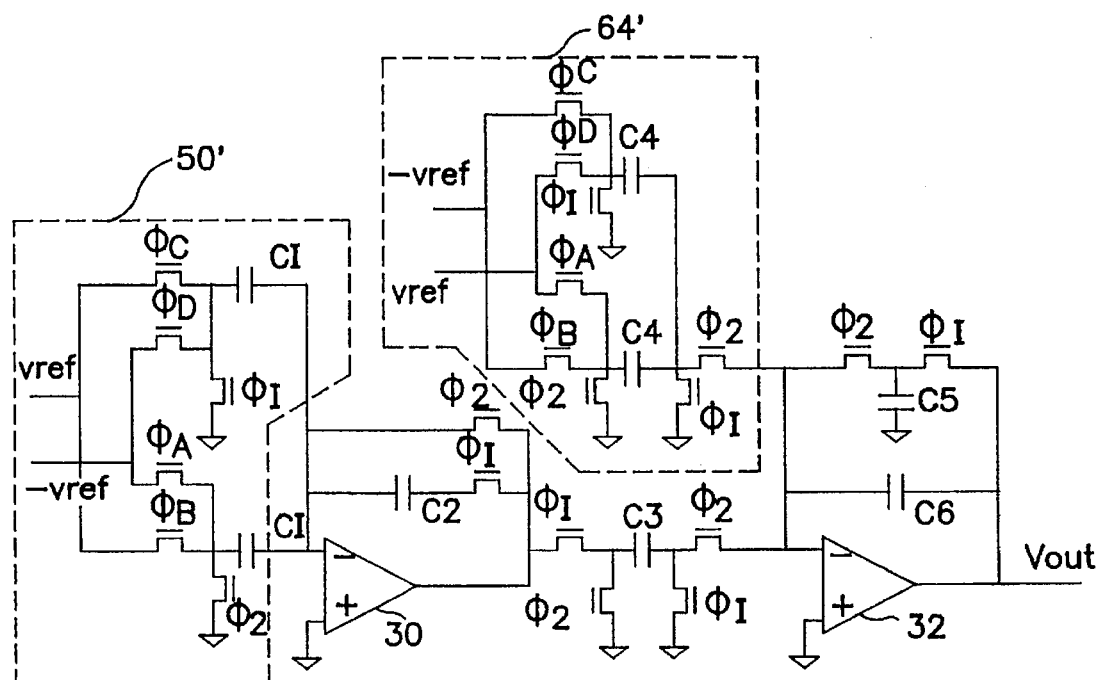
FIG. 5 is a circuit diagram of a further embodiment of the loop filter of the present invention.

The embodiment of FIG. 4 considers the phase error signal $\phi e$ during clock $\phi 1$, but not during $\phi 2$. With reference now to FIG. 5, circuitry may be added to the offset cancellation circuitry 50' and inverter circuitry 64' so that the phase error signal is considered during both $\phi 1$ and $\phi 2$, thereby allowing asynchronous operation and zero phase error. Clock signal $\phi C$ is enabled when the VCO phase lags the input signal $\phi$in, and clock signal $\phi D$ is enabled when the VCO phase leads the input signal $\phi$in.

Further embodiments of the circuit are possible for removing second order phase error due to clock feedthrough. These may be fully differential or as otherwise known in the art.

The circuits herein are adaptable to integrated PLL circuits as all of the components may be formed in an IC with conventional techniques. The outputs are valid for all times, and the loop dynamics may be controlled with increased flexibility.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A loop filter for a phase locked loop (PLL) circuit, the loop filter for converting a reference voltage to a control voltage for a voltage controlled oscillator (VCO) based on a phase difference between a signal from the VCO and a reference signal, the loop filter comprising:

a first operational amplifier that is offset nulled to eliminate the effect of offset on the PLL circuit, said first operational amplifier having an output and an input connected by a first capacitor that is switched responsively to a clock input, said first operational amplifier and said first capacitor forming an offset nulled integrator;

two switches connected in parallel between said input and said output of said first operational amplifier, said first capacitor being connected in series with one of said two switches, wherein during operation of the PLL circuit one of said two switches is on when the other is off; and a second operational amplifier for resistively damping the output from said offset nulled integrator, said second operational amplifier having an output and an input connected by a second capacitor that is switched responsively to a clock input, wherein said loop filter provides a transfer function, $Vout=-I_o((1/Cs)+R)$.

2. The filter of claim 1 wherein each of said two switches is a FET.

3. The filter of claim 1 further comprising two further switches connected in series between said input and said output of said second operational amplifier with a third capacitor grounded therebetween, said second capacitor being connected in parallel with said two further switches, wherein during operation of the PLL circuit one of said two further switches is on when the other is off.

4. The filter of claim 3 wherein said second and third capacitors have substantially equal capacitance.

5. The filter of claim 3 wherein each of said two further switches is a FET.

6. The filter of claim 1 wherein said loop filter does not comprise resistors.

7. The filter of claim 1 further comprising means for changing a polarity of the reference voltage provided to the input of said first operational amplifier in response to a polarity change of the phase difference.

8. The filter of claim 7 further comprising means for providing the reference voltage to said input of said second operational amplifier with a polarity opposite to the polarity of the reference voltage provided to said first operational amplifier.

9. A phase locked loop circuit comprising:

a voltage controlled oscillator;

a phase detector for comparing a phase from said oscillator to a phase of an input reference signal and providing a phase error signal responsive to the comparison; and a loop filter for receiving the phase error signal and for providing a transfer function, $Vout=-I_o((1/Cs)+R)$ and a control voltage to said oscillator, said loop filter comprising, an offset nulled integrator for reducing the phase error magnitude, said offset nulled integrator comprising a first operational amplifier having an output and an input connected by a first capacitor that is switched responsively to a clock input, and two first switches responsive to the clock input that are connected in parallel between said input and said output of said first operational amplifier, said first capacitor being connected in series with one of said two first switches, and a sample and hold circuit for resistively damping an output from said offset nulled integrator, wherein the phase error is independent of an offset voltage in said sample and hold circuit.

10. The phase locked loop circuit of claim 9 wherein each of said first and second switches is a FET.

11. The phase locked loop circuit of claim 9 wherein said loop filter does not comprise resistors.

12. The phase locked loop circuit of claim 9 further comprising means for changing a polarity of a control voltage provided to the input of said first operational amplifier in response to a polarity change of the phase error signal.

13. The phase locked loop circuit of claim 12 further comprising means for providing the control voltage to said input of said second operational amplifier with a polarity opposite to the polarity of the control voltage provided to said first operational amplifier.

14. The phase locked loop circuit of claim 9 formed in a monolithic integrated circuit.

15. The phase locked loop circuit of claim 9 wherein said sample and hold circuit comprises a second operational amplifier having an output and an input connected by a second capacitor that is switched responsively to a clock input.

16. The phase locked loop circuit of claim 15 wherein said sample and hold circuit further comprises two second switches responsive to the clock input that are connected in series between said input and said output of said second operational amplifier with a third capacitor grounded therebetween, said second capacitor being connected in parallel with said two switches.

17. The phase locked loop circuit of claim 16 wherein said second and third capacitors have substantially equal capacitance.

* * * * *